(12) United States Patent
Lee et al.

(10) Patent No.: US 12,207,362 B2
(45) Date of Patent: Jan. 21, 2025

(54) SUPPORT UNIT, SUBSTRATE TREATING APPARATUS INCLUDING THE SAME AND TEMPERATURE CONTROL METHOD

(71) Applicant: SEMES CO., LTD., Chungcheongnam-do (KR)

(72) Inventors: Chung Woo Lee, Gyeonggi-do (KR); In Kyu Park, Gyeonggi-do (KR); Yong Seok Jang, Chungcheongnam-do (KR); Sung Youn Jeon, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 397 days.

(21) Appl. No.: 17/534,329

(22) Filed: Nov. 23, 2021

(65) Prior Publication Data

US 2022/0167462 A1    May 26, 2022

(30) Foreign Application Priority Data

Nov. 24, 2020    (KR) .................. 10-2020-0158726

(51) Int. Cl.
*H01J 37/32*    (2006.01)
*H05B 1/02*    (2006.01)

(52) U.S. Cl.
CPC ...... *H05B 1/0233* (2013.01); *H01J 37/32724* (2013.01); *H01J 2237/334* (2013.01); *H05B 2203/005* (2013.01)

(58) Field of Classification Search
CPC ............. H05B 1/0233; H05B 2203/005; H01J 37/32724; H01J 2237/334

USPC ..................................................... 156/345.52
See application file for complete search history.

(56) References Cited

U.S. PATENT DOCUMENTS

| | | | | |
|---|---|---|---|---|
| 5,523,554 | A * | 6/1996 | Hassler | H04N 5/32 250/370.11 |
| 2007/0139304 | A1* | 6/2007 | Iwami | G09G 3/294 345/60 |
| 2014/0090783 | A1* | 4/2014 | Kim | H01J 37/32651 156/345.48 |
| 2017/0186592 | A1* | 6/2017 | Ni | H01J 37/32532 |
| 2018/0040496 | A1* | 2/2018 | Lee | H01L 21/67248 |
| 2020/0211873 | A1* | 7/2020 | Zhao | H01L 21/67248 |
| 2020/0211874 | A1* | 7/2020 | Lee | H01L 21/67109 |
| 2023/0029721 | A1* | 2/2023 | Lee | H01L 21/67213 |
| 2023/0060901 | A1* | 3/2023 | Park | H01J 37/32724 |

(Continued)

FOREIGN PATENT DOCUMENTS

| | | |
|---|---|---|
| JP | S5940271 B2 | 9/1984 |
| JP | 04352445 A | 12/1992 |
| JP | 201737846 A | 2/2017 |

(Continued)

*Primary Examiner* — Charlee J. C. Bennett
(74) *Attorney, Agent, or Firm* — Procopio, Cory, Hargreaves & Savitch LLP

(57) ABSTRACT

A support unit may include a plurality of heaters disposed in a matrix form in the support unit to heat a substrate, and a power supply unit for supplying power to the plurality of heaters, wherein a current applied to the plurality of heaters is controlled by switches connected to rows and columns of the matrix, respectively, and the switches connected to the rows of the matrix include first switches capable of controlling the current applied to the rows of the matrix and second switches connected in parallel with the first switches.

16 Claims, 7 Drawing Sheets

(56) References Cited

U.S. PATENT DOCUMENTS

2023/0070679 A1\* 3/2023 Park .................. H01L 21/67248
2023/0075120 A1\* 3/2023 Park .................. H01L 21/67109

FOREIGN PATENT DOCUMENTS

| JP | 2017162825 A | | 9/2017 | |
|---|---|---|---|---|
| JP | 2017191940 A | | 10/2017 | |
| KR | 2006033241 A | \* | 4/2006 | ........... G01R 31/024 |
| KR | 1020060033241 A | | 4/2006 | |
| KR | 1020140084010 A | | 7/2014 | |
| KR | 1020170123830 A | | 11/2017 | |
| KR | 1020200083927 A | | 7/2020 | |

\* cited by examiner

SUPPORT UNIT, SUBSTRATE TREATING APPARATUS INCLUDING THE SAME AND TEMPERATURE CONTROL METHOD

CROSS-REFERENCE TO RELATED APPLICATIONS

This application claims priority to and the benefit of the Korean Patent Application No. 10-2020-0158726 filed in the Korean Intellectual Property Office on Nov. 24, 2020, the entire contents of which are incorporated herein by reference.

TECHNICAL FIELD

The present invention relates to a support unit, a substrate treating apparatus including the same, and a temperature control method. More particularly, to a heater included in a support unit and a temperature control method using a switch structure connected to the heater.

BACKGROUND ART

In the case of a temperature control method using a conventional micro heater, there was used a method of sensing a voltage and a current for a heater to be targeted and calculating a resistance value of each heater from the sensed values to adjust output power to be applied to the heater.

In the case of a matrix structure using the conventional micro heater, a configuration without including diodes is used and a circuit structure is simply provided. However, there were problems that due to the current of heaters adjacent to a target heater, it is difficult to measure accurate current for the target heater, and as a result, the temperature control of the target heater is inaccurate.

SUMMARY OF THE INVENTION

The present invention has been made in an effort to accurately control a temperature in a specific target heater region among a plurality of heaters.

The problem to be solved by the present invention is not limited to the above-mentioned problems. The problems not mentioned will be clearly understood by those skilled in the art from the present specification and the accompanying drawings.

An exemplary embodiment of the present invention provides a support unit.

The support unit may include a plurality of heaters disposed in a matrix form in the support unit to heat a substrate, and a power supply unit for supplying power to the plurality of heaters, wherein a current applied to the plurality of heaters is controlled by switches connected to rows and columns of the matrix, respectively, and the switches connected to the rows of the matrix include first switches capable of controlling the current applied to the rows of the matrix and second switches connected in parallel with the first switches.

In the exemplary embodiment, one end of the second switch may be connected in parallel with one end of the first switch and the other end of the second switch may be connected with the ground.

In the exemplary embodiment, the first switch and the second switch may be connected to each row of the matrix, respectively.

In the exemplary embodiment, the support unit may further include third switches connected to columns of the matrix, respectively.

In the exemplary embodiment, the support unit may further include a control unit for controlling on/off of the first switches, the second switches, and the third switches.

In the exemplary embodiment, the control unit may connect the first switch of the row connected with the target heater and the third switch of the column connected with the target heater, in order to measure the current of the target heater included in the matrix.

In the exemplary embodiment, the control unit may control the second switches of other rows which are not connected with the target heater to be connected.

In the exemplary embodiment, the control unit may control any one of the first switch and the second switch connected to each of the plurality of rows included in the matrix to be connected.

In the exemplary embodiment, the control unit may control only one of the first switches corresponding to the number of the plurality of rows to be connected and controls the second switches to be connected in the remaining rows.

Another exemplary embodiment of the present invention provides a substrate treating apparatus.

The substrate treating apparatus may include a process chamber having a treating space; a support unit supporting a substrate in the treating space; a gas supply unit supplying process gas to the treating space; and a plasma source generating plasma from the process gas, wherein the support unit may include a plurality of heaters disposed in a matrix form in the support unit to heat a substrate, a power supply unit for supplying power to the plurality of heaters, wherein the current applied to the plurality of heaters is controlled by switches connected to rows and columns of the matrix, respectively, and the switches connected to the rows of the matrix include first switches capable of controlling the current applied to the rows of the matrix and second switches connected in parallel with the first switches.

Yet another exemplary embodiment of the present invention provides a method of performing a temperature control of a substrate using a support unit.

The method may include the steps of selecting a region of a heater to be controlled as a target as a target heater; controlling a switch so that a current flows in only the region of the selected heater; measuring a current value flowing in the region of the selected heater to check a temperature of the region of the selected heater; and controlling a temperature of the region of the selected heater.

In the exemplary embodiment, the controlling of the switch so that the current flows in only the region of the selected heater may be to control the first switch of the row connected with the target heater to be connected and the third switch of the column connected with the target heater to be connected.

In the exemplary embodiment, the controlling of the switch so that the current flows in only the region of the selected heater may be to control the second switches of other rows which are not connected with the target heater to be connected.

In the exemplary embodiment, the measuring of the current value flowing in the region of the selected heater to check the temperature of the region of the selected heater may be to calculate a resistance value based on the measured current value to measure the temperature.

In the exemplary embodiment, the controlling of the temperature of the region of the selected heater may be to control the output power of the heater region to be adjusted.

Still another exemplary embodiment of the present invention provides a method of performing a temperature control of a substrate using a support unit.

The method may include the steps of setting a heater region to control the temperature as a target heater and setting target power of the target heater; controlling a switch so that a current flows in only the region of the selected heater; measuring a current value flowing in the region of the selected heater to check a temperature of the region of the selected heater; and checking whether to match the temperature of the heater region with the target power.

In the exemplary embodiment, the method may further include controlling the temperature of the heater region through a feedback control when the temperature of the heater region is not matched.

According to the present invention, it is possible to measure a current in a desired target heater to calculate a temperature and perform a closed loop control to perform an accurate temperature control.

The effect of the present invention is not limited to the foregoing effects. Non-mentioned effects will be clearly understood by those skilled in the art from the present specification and the accompanying drawings.

DETAILED DESCRIPTION

Figure 1A:
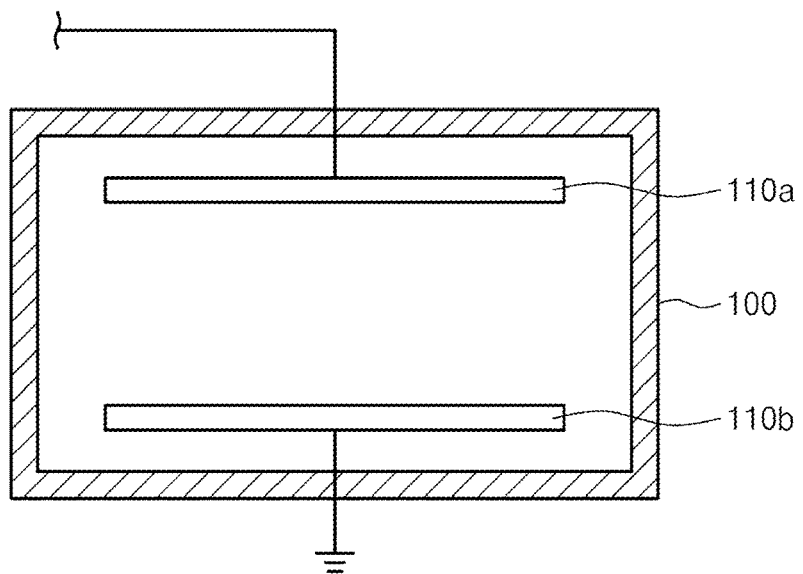
FIGS. 1A and 1B are diagrams illustrating a schematic configuration of a chamber according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the term of "including" any component will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

The "unit" used herein may refer a hardware component such as software, FPGA or ASIC, as a unit for processing at least one function or operation. However, the "unit" is not a meaning limited to software or hardware. The "unit" may be configured to be on an addressable storage medium and may be configured to play back one or more processors.

As one example, the "unit" includes components such as software components, object oriented software components, class components, and task components, processes, functions, attributes, procedures, subroutines, segments of a program code, drivers, firmware, microcodes, circuits, data, databases, data structures, tables, arrays, and variables. The functions provided by the component and the 'unit' may be separately performed by a plurality of components and 'units', or may be integrated with other additional components.

Hereinafter, an exemplary embodiment of the present invention will be described in more detail with reference to the accompanying drawings. The exemplary embodiment of the present invention can be modified in various forms, and it should not be construed that the scope of the present invention is limited to exemplary embodiments described below. The exemplary embodiments will be provided to more completely describe the present invention to those skilled in the art. Therefore, shapes, and the like of components in the drawings will be exaggerated to emphasize a more clear description.

Figure 1B:
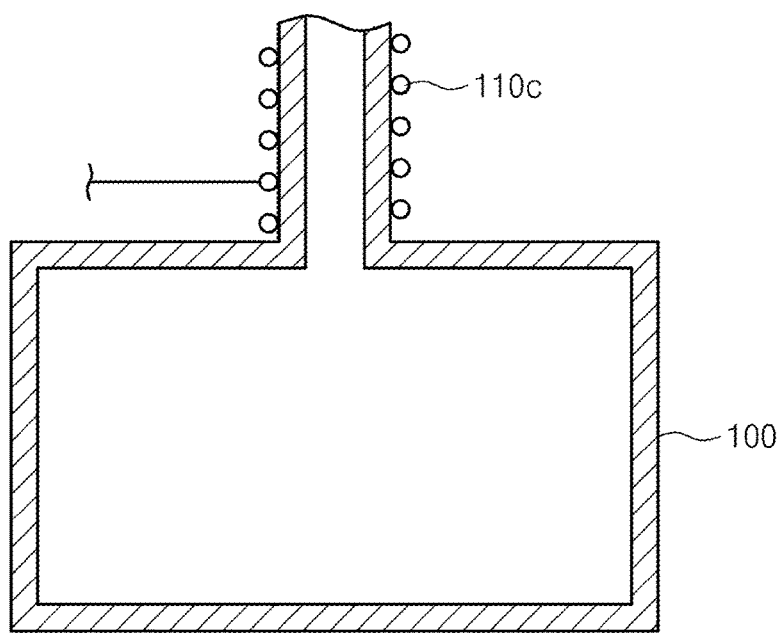

FIGS. 1A and 1B are diagrams illustrating a schematic configuration of a chamber according to an exemplary embodiment of the present invention.

As illustrated in FIGS. 1A and 1B, a plasma chamber 100 may include electrodes 110a and 110b to which RF signals are applied. The electrodes 110a and 110b may transmit electrical energy to the chamber so that gas to be introduced into the chamber is ionized and changed into a plasma state. The electrodes 110a and 110b illustrated in FIG. 1A illustrates an example of a capacitively coupled plasma (CCP) source disposed so that two electrode plates in the chamber face each other. The CCP source may transmit electric energy to electrons of the gas introduced into the chamber using a capacitively electric field. The CCP source may have a form in which an RF power supply is connected to two electrode plates, but the RF power supply may also be connected only to the upper electrode plate of the two electrode plates according to an exemplary embodiment. An electrode 110c illustrated in FIG. 1B illustrates an example of an inductively coupled plasma (ICP) source consisting of inductive coils wound outside the chamber 100. Since the plasma generation device is separately coupled to the upper portion of the chamber, the ICP source may change the gas introduced in the chamber into a plasma state and provide the plasma to the chamber in a downstream method.

Figure 2:
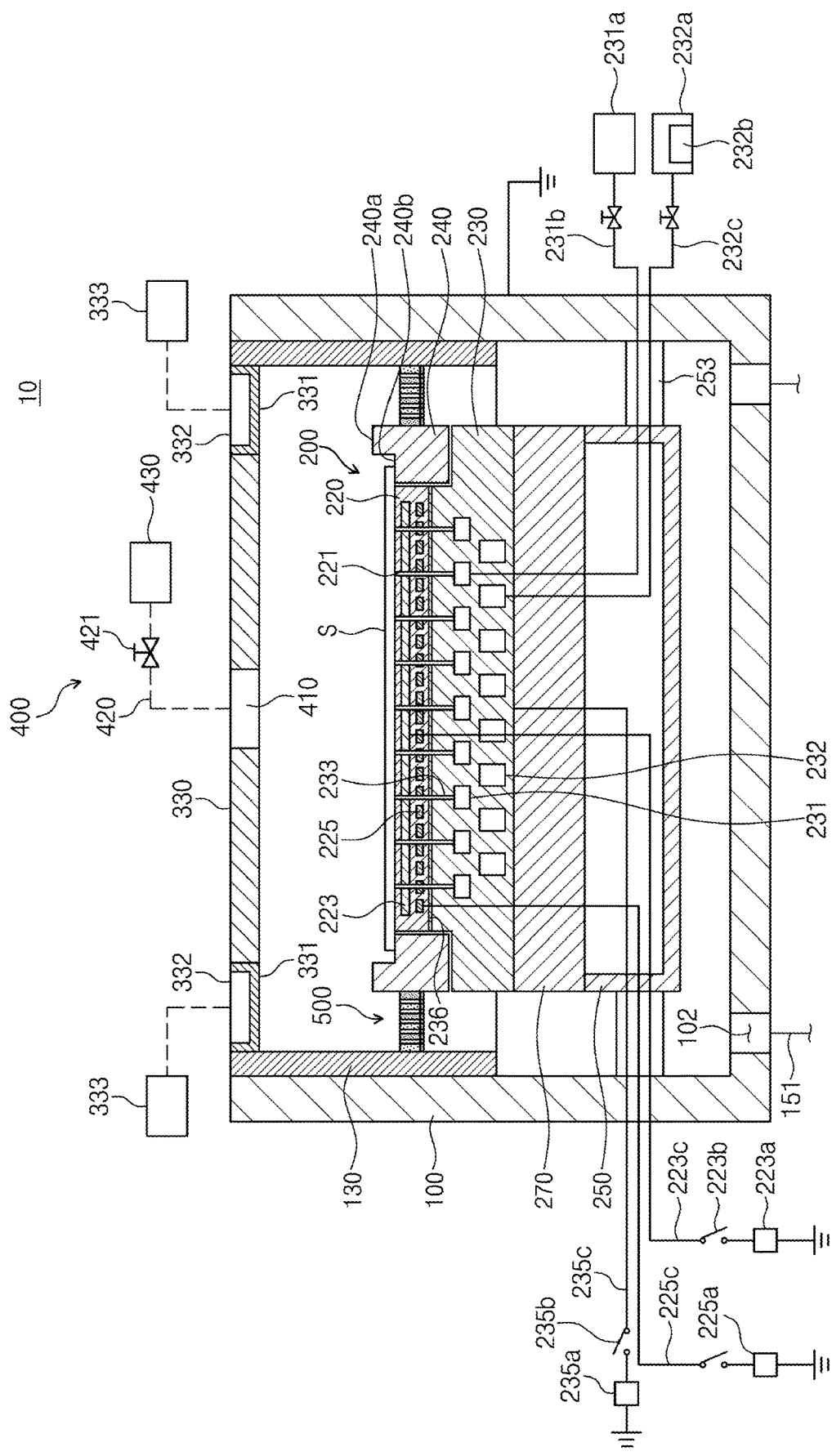
FIG. 2 is a diagram illustrating a configuration of a substrate treating apparatus according to an exemplary embodiment of the present invention.

FIG. 2 is a diagram illustrating a configuration of a substrate treating apparatus according to an exemplary embodiment of the present invention.

Referring to FIG. 2, the substrate treating apparatus 10 processes a substrate S using plasma. For example, the substrate treating apparatus 10 may perform an etching process for the substrate S. The substrate treating apparatus 10 may include a chamber 100, a substrate support unit 200, a plasma generation unit 300, a gas supply unit 400, and a baffle unit 500.

The chamber 100 may provide a treating space in which a substrate treating process is performed therein. The chamber 100 may have a treating space therein and may be provided in a closed shape. The chamber 100 may be provided with a metallic material. The chamber 100 may be provided with an aluminum material. The chamber 100 may be grounded. An exhaust hole 102 may be formed in the bottom surface of the chamber 100. The exhaust hole 102 may be connected with an exhaust line 151. Reaction by-products generated in the processing process and gas left in the inner space of the chamber may be discharged to the outside via an exhaust line 151. The inside of the chamber 100 may be decompressed in a predetermined pressure by the exhaust process.

According to an example, a liner 130 may be provided in the chamber 100. A liner 130 may have a cylindrical shape with opened upper and lower surfaces. The liner 130 may be provided to be in contact with the inner surface of the chamber 100. The liner 130 protects the inner wall of the chamber 100 to prevent the inner wall of the chamber 100 from being damaged by arc discharge. Further, impurities generated during the substrate treating process may be prevented from being deposited on the inner side wall of the chamber 100.

The substrate support unit 200 may be located inside the chamber 100. The substrate support unit 200 may support the substrate S. The substrate support unit 200 may include an electrostatic chuck 210 for adsorbing the substrate S using an electrostatic force. Unlike this, the substrate support unit 200 may support the substrate S in various methods such as mechanical clamping. Hereinafter, the substrate support unit 200 including the electrostatic chuck 210 will be described.

The substrate support unit 200 may include an electrostatic chuck 210, a lower cover 250, and a plate 270. The substrate support unit 200 may be spaced apart from the bottom surface of the chamber 100 inside the chamber 100.

The electrostatic chuck 210 may include a dielectric plate 220, a body 230, and a focusing ring 240. The electrostatic chuck 210 may support the substrate S. The dielectric plate 220 may be located at the upper end of the electrostatic chuck 210. The dielectric plate 220 may be provided as a disk-shaped dielectric substance. The substrate S may be placed on the upper surface of the dielectric plate 220. The upper surface of the dielectric plate 220 may have a radius smaller than the substrate S. Therefore, an edge region of the substrate S may be located outside the dielectric plate 220.

The dielectric plate 220 may include a first electrode 223, a heater 225 and a first supply flow channel 221 therein. The first supply flow channel 221 may be provided on a bottom surface from the upper surface of the dielectric plate 210. A plurality of first supply flow channels 221 may be spaced apart from each other, and may be provided as a passage to which the heat transfer medium is supplied to the lower surface of the substrate S.

The first electrode 223 may be electrically connected to a first power supply 223*a*. The first power supply 223*a* may include a DC power supply. A switch 223*b* may be provided between the first electrode 223 and the first power supply 223*a*. The first electrode 223 may be electrically connected to the first power supply 223*a* by ON/OFF of the switch 223*b*. When the switch 223*b* is turned on, a direct current may be applied to the first electrode 223. The electrostatic force is applied between the first electrode 223 and the substrate S by the current applied to the first electrode 223, and the substrate S may be adsorbed to the dielectric plate 220 by the electrostatic force. The heater 225 may be located in the lower portion of the first electrode 223. The heater 225 may be electrically connected to a second power supply 225*a*. The heater 225 may generate heat by resisting the current applied to the second power supply 225*a*. The generated heat may be transmitted to the substrate S through the dielectric plate 220. The substrate S may be maintained at a predetermined temperature by the heat generated in the heater 225. The heater 225 may include a spiral coil.

The body 230 may be located at a lower portion of the dielectric plate 220. The lower surface of the dielectric plate 220 and the upper surface of the body 230 may adhere to each other by an adhesive 236. The body 230 may be provided with an aluminum material. The upper surface of the body 230 may be stepped so that a central region is higher than an edge region. The central region of the upper surface of the body 230 has an area corresponding to the lower surface of the dielectric plate 220 and may adhere to the lower surface of the dielectric plate 220. The body 230 may be formed with a first circulation flow channel 231, a second circulation flow channel 232 and a second supply flow channel 233 therein.

The first circulation flow channel 231 may be provided as a passage for circulating a heat transfer medium. The first circulation flow channel 231 may be formed in a spiral shape inside the body 230. Alternatively, the first circulation flow channel 231 may be disposed so that ring-shaped flow channels having different radii have the same center. The respective first circulation flow channels 231 may communicate with each other. The first circulation flow channels 231 may be formed at the same height.

The second circulation flow channel 232 may be provided as a passage for circulating a cooling fluid. The second circulation flow channel 232 may be formed in a spiral shape inside the body 230. Alternatively, the second circulation flow channel 232 may be disposed so that ring-shaped flow channels having different radii have the same center. The respective second circulation flow channels 232 may communicate with each other. The second circulation flow channel 232 may have a cross-sectional area greater than the first circulation flow channel 231. The second circulation flow channels 232 may be formed at the same height. The second circulation flow channel 232 may be located below the first circulation flow channel 231.

The second supply flow channel 233 extends upward from the first circulation flow channel 231 and may be provided as the upper surface of the body 230. The second supply flow channels 243 are provided in the number corresponding to the first supply flow channels 221, and may connect the first circulation flow channel 231 and the first supply flow channel 221 to each other.

The first circulation flow channel 231 may be connected to a heat transfer medium storage unit 231*a* via a heat transfer medium supply line 231b. A heat transfer medium may be stored in the heat transfer medium storage unit 231a. The heat transfer medium may include inert gas. According to the exemplary embodiment, the heat transfer medium may include helium (He) gas. The helium gas is supplied to the first circulation flow channel 231 through the supply line 231b, and may be supplied to the lower surface of the substrate S sequentially through the second supply flow channel 233 and the first supply flow channel 221. The helium gas may serve as a medium for transmitting the heat transmitted to the substrate S to the electrostatic chuck 210 in the plasma.

The second circulation flow channel 232 may be connected to a cooling fluid storage unit 232a via a cooling fluid supply line 232c. A cooling fluid may be stored in the cooling fluid storage unit 232a. A cooler 232b may be provided in the cooling fluid storage unit 232a. The cooler 232b may cool the cooling fluid to a predetermined temperature. Unlike this, the cooler 232b may be provided on the cooling fluid supply line 232c. The cooling fluid supplied to the second circulation flow channel 232 through the cooling fluid supply line 232c may circulate along the second circulation flow channel 232 and cool the body 230. The body 230 may cool the dielectric plate 220 and the substrate S together while cooling to maintain the substrate S to a predetermined temperature.

The body 230 may include a metal plate. According to an exemplary embodiment, the entire body 230 may be provided as a metal plate. The body 230 may be electrically connected to a third power supply 235a. The third power supply 235a may be provided as a high-frequency power supply for generating high-frequency power. The high-frequency power supply may include an RF power supply. The body 230 may receive the high-frequency power from the third power supply 235a. As a result, the body 230 may function as an electrode, that is, a lower electrode.

A ring member 240 may be disposed in an edge region of the electrostatic chuck 210. The ring member 240 has an annular ring shape and may be disposed along the circumference of the dielectric plate 220. In particular, the ring member 240 may consist of a plurality of rings including a focus ring. Particularly, the upper surface of the ring member 240 may be stepped so that an outer portion 240a is higher than an inner portion 240b. The inner portion 240b of the upper surface of the ring member 240 may be located at the same height as the upper surface of the dielectric plate 220. The inner portion 240b of the upper surface of the ring member 240 may support the edge region of the substrate S located outside the dielectric plate 220. The outer portion 240a of the ring member 240 may be provided to surround the edge region of the substrate S. The ring member 240 may control an electromagnetic field so that the density of the plasma is uniformly distributed in the entire region of the substrate S. As a result, the plasma may be uniformly formed across the entire region of the substrate S so that each region of the substrate S may be uniformly etched.

The lower cover 250 may be located at the lower end of the substrate support unit 200. The lower cover 250 may be located to be spaced apart upward from the bottom surface of the chamber 100. The lower cover 250 may be formed with a space 255 having an opened upper surface therein. The outer radius of the lower cover 250 may be provided with the same length as the outer radius of the body 230. In the inner space 255 of the lower cover 250, a lift pin module (not illustrated) or the like that moves the substrate S to be transferred from an external transfer member to the electrostatic chuck 210 may be located. The lift pin modules (not illustrated) may be located to be spaced apart from the lower cover 250 at predetermined intervals. The lower surface of the lower cover 250 may be provided with a metallic material. The inner space 255 of the lower cover 250 may be provided with air. Since the air has a dielectric constant lower than an insulator, the air may serve to reduce the electromagnetic field inside the substrate support unit 200.

The lower cover 250 may have a connection member 253. The connection member 253 may connect an outer surface of the lower cover 250 and an inner wall of the chamber 100 to each other. A plurality of connection members 253 may be provided on the outer surface of the lower cover 250 with a plurality of intervals. The connection member 253 may support the substrate support unit 200 inside the chamber 100. In addition, the connection member 253 is connected to the inner wall of the chamber 100 so that the lower cover 250 is electrically grounded. A first power supply line 223c connected with the first power supply 223a, a second power supply line 225c connected with the second power supply 225a, a third power supply line 235c connected with the third power supply 235a, a heat transfer medium supply line 231b connected to the heat transfer medium storage unit 231a, a cooling fluid supply line 232c connected with the cooling fluid storage unit 232a, and the like may extend to the inside of the lower cover 250 through the inner space 255 of the connection member 253.

The plate 270 may be located between the electrostatic chuck 210 and the lower cover 250. The plate 270 may cover the upper surface of the lower cover 250. The plate 270 may be provided in a cross-sectional area corresponding to the body 230. The plate 270 may include an insulator. According to an exemplary embodiment, one or a plurality of plate(s) 270 may be provided. The plate 270 may serve to increase an electrical distance between the body 230 and the lower cover 250.

The plasma generation unit 300 may excite process gas in the chamber 100 into a plasma state. The plasma generation unit 300 may use a capacitively coupled plasma type plasma source. When the CCP type plasma source is used, the upper electrode 330 and the lower electrode 230, that is, the body, may be included in the chamber 100. The upper electrode 330 and the lower electrode 230 may be disposed up and down in parallel with each other with a treating space interposed therebetween. The upper electrode 330 as well as the lower electrode 230 may also receive energy for generating the plasma by receiving the RF signal by the RF power supply 310, and the number of RF signals applied to each electrode is not limited to one as illustrated in the drawing. An electric field is formed in a space between the both electrodes, and the process gas supplied to the space may be excited into the plasma state. A substrate treating process is performed using this plasma. The CCP type described herein has been described, but is not limited thereto, and the plasma generation unit 300 may be configured as an inductively coupled plasma (ICP) type.

The plasma generation unit 300 may be provided with a gas dispersion plate. Although not illustrated in the drawing, the gas dispersion plate may be disposed to be spaced apart from the upper surface of the chamber 100 at a predetermined distance. The gas dispersion plate may be fixed by a support unit formed on the edge of the upper surface of the chamber 100. The gas dispersion plate may be provided in a plate shape with a constant thickness. The lower surface of the gas dispersion plate may be polarized to prevent the arc generated by the plasma. The cross-sectional area of the gas dispersion plate may be provided to be the same as the cross-sectional area of the substrate support unit 200. The gas dispersion plate includes a plurality of injection holes. The injection holes may penetrate through the upper surface and the lower surface of the gas dispersion plate in a vertical direction. The gas dispersion plate 310 may include a metallic material. The gas dispersion plate 310 of the metallic material may perform a function as the upper electrode.

The gas supply unit 400 may supply process gas into the chamber 100. The gas supply unit 400 may include a gas supply nozzle 410, a gas supply line 420, and a gas storage unit 430. The gas supply unit 410 may be provided at the center of the upper surface of the chamber 100. An injection port may be formed on the lower surface of the gas supply nozzle 410. The injection port may supply process gas into the chamber 100. The gas supply line 420 may connect the gas supply nozzle 410 and the gas storage unit 430 to each other. The gas supply line 420 may supply the process gas stored in the gas storage unit 430 to the gas supply nozzle 410. The gas supply line 420 may be provided with a valve 421. The valve 421 may open and close the gas supply line 420 and adjust the flow rate of the process gas supplied through the gas supply line 420.

The baffle unit 500 may be located between the inner wall of the chamber 100 and the substrate support unit 200. The baffle 510 may be provided in an annular ring shape. A plurality of through holes 511 may be formed in the baffle 510. The process gas provided in the chamber 100 may be exhausted to the exhaust hole 102 through the through holes 511 of the baffle 510. The flow of the process gas may be controlled according to the shape of the baffle 510 and the shapes of the through holes 511.

Figure 3:
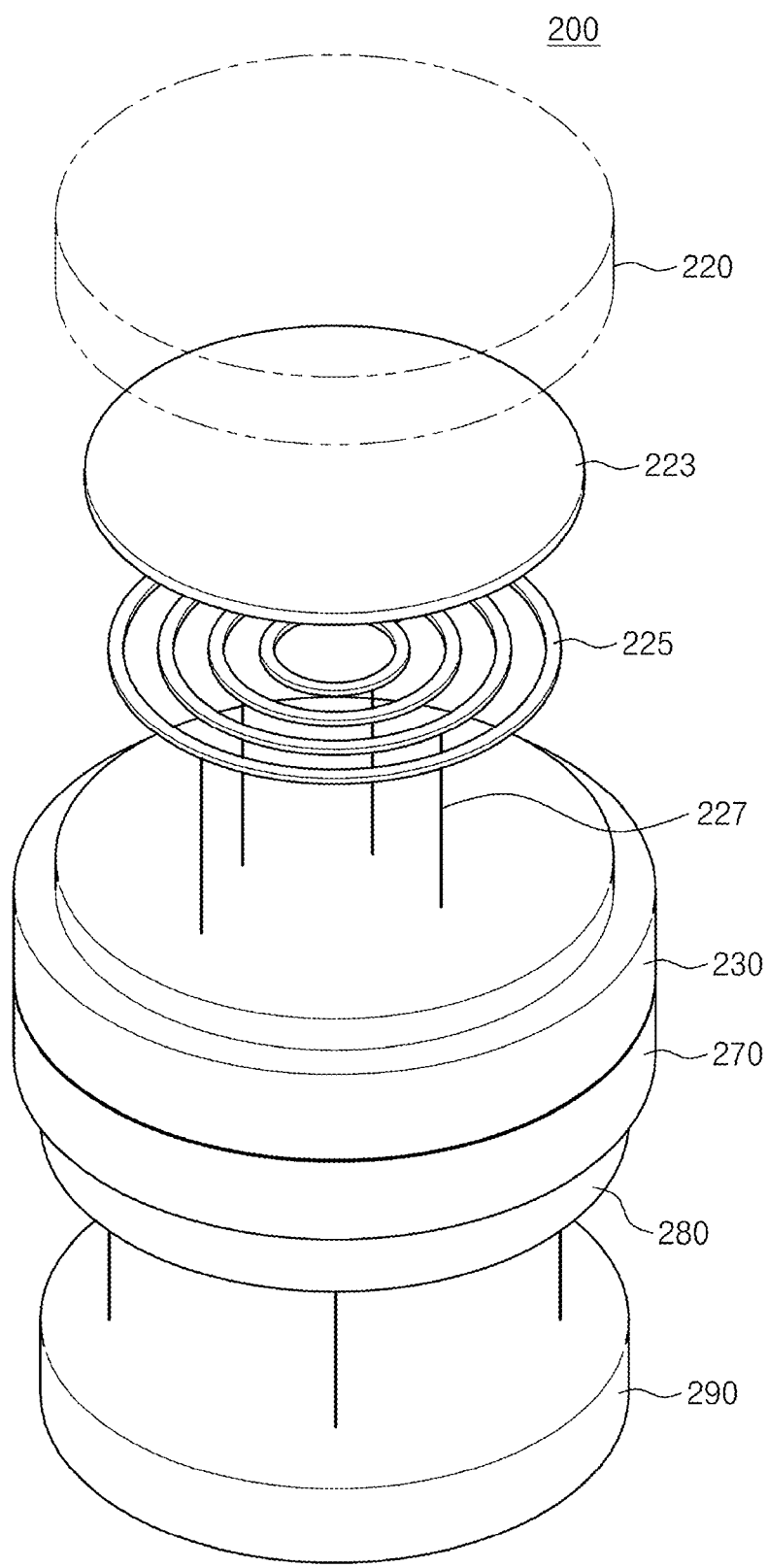
FIG. 3 is a diagram illustrating an exploded perspective view of a support unit according to an exemplary embodiment of the present invention.

FIG. 3 is a diagram illustrating an exploded perspective view of the support unit 200 according to an exemplary embodiment of the present invention.

In the support unit 200 according to FIG. 3, the description of the components described in the support unit 200 of FIG. 2 described above will be omitted. According to FIG. 3, the support unit 200 according to the present invention may further include a control board 290, a connection board 280, and a connection electrode unit 227.

The control board 290 according to the present invention may control a first switch 231, a second switch 232 and a third switch 233 connected to the heater 230 in a matrix structure included in the support unit 200 according to the present invention. In the exemplary embodiment, the control board 290 according to the present invention may include a control unit to be described below. The control board 290 may generate control signals for controlling the first switch 231, the second switch 232 and the third switch 233 connected to the heater 230 in the matrix structure included in the support unit 200 according to the present invention and apply the control signals. The control signal may be a digital signal, for example, an on/off signal. The control board 290 may be implemented as a computer or a device similar thereto using hardware, software, or a combination thereof.

In the hardware, the control board 290 may be implemented as application specific integrated circuits (ASICs), digital signal processors (DSPs), digital signal processing devices (DSPDs), programmable logic devices (PLDs), field programmable gate arrays (FPGAs), processors, micro-controllers, microprocessors, or electronic devices for performing control functions similar thereto.

In the software, the control board 290 may be implemented as a software code or a software application according to one or a plurality of programming languages. The software may be executed by a controller implemented in hardware. In addition, the software may also be transmitted and provided as the hardware configuration described above from an external device such as a server or the like.

In the exemplary embodiment, the connection board 280 may be disposed between the heater 225 and the control board 290. In the exemplary embodiment, the connection electrode unit 227 may electrically connect the heater 225, the control board 290, and the connection board 280 to each other.

The support unit 200 according to the present invention may include a plurality of heaters 225 disposed in a matrix form in the support unit 200 to heat the substrate, a power supply unit 225a supplying the power to the plurality of heaters 225, and switches 231, 232, and 233 connected to rows and columns of a heater matrix. The support unit 200 according to the present invention may further include a control unit 290 for controlling the on/off of the switches 231, 232, and 233 connected to rows and columns of the heater matrix.

Hereinafter, a connection structure and a control method of the heater 225 matrix according to the present invention will be described in detail through a circuit diagram.

Figure 4:
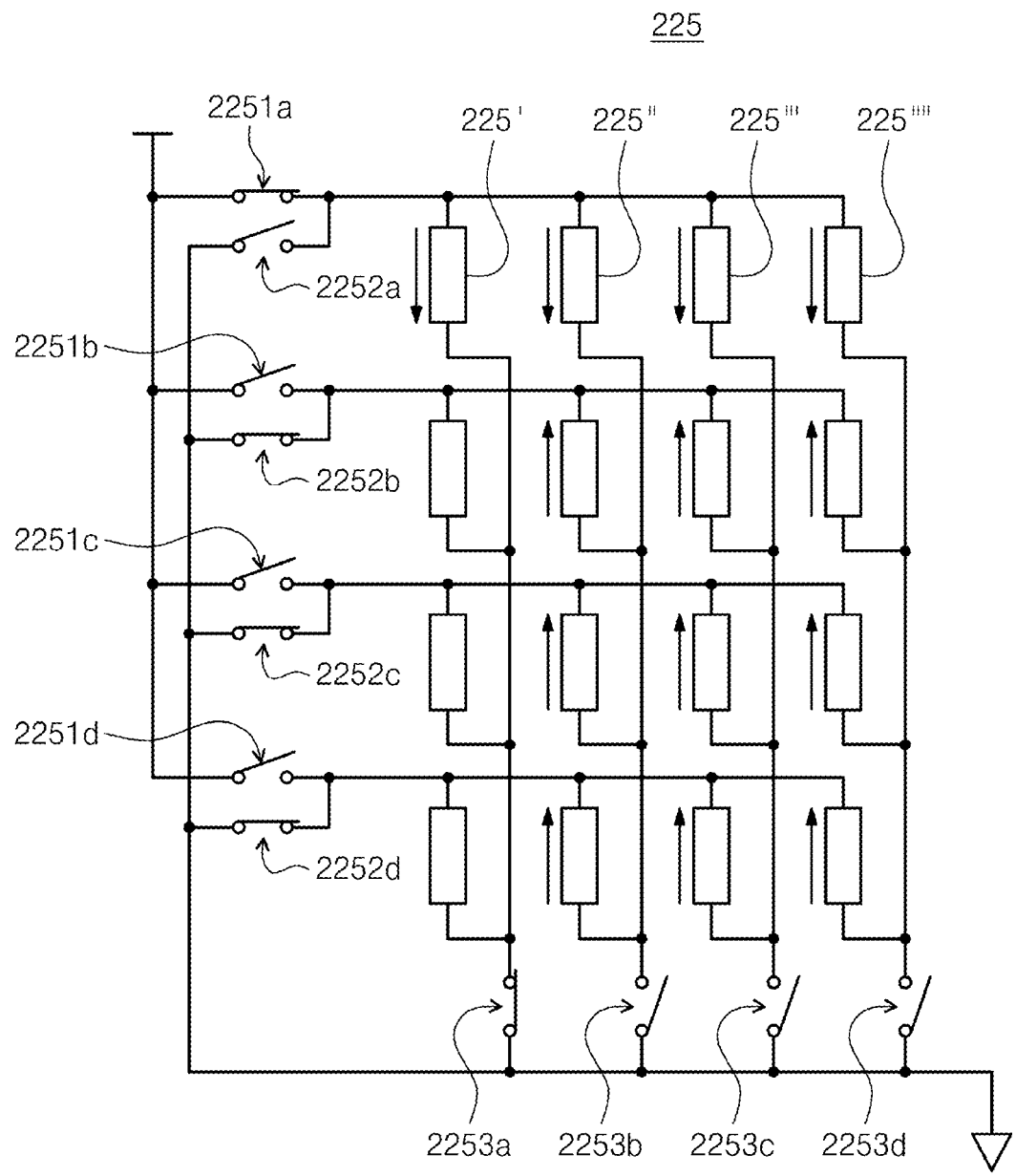
FIG. 4 is a diagram illustrating a structure of a heater matrix according to an exemplary embodiment of the present invention.

FIG. 4 is a diagram illustrating a structure of the heater 225 matrix according to an exemplary embodiment of the present invention.

Referring to FIG. 4, the heater 225 matrix according to the present invention may include a plurality of heaters 225', 225", 225''', 225'''' . . . arranged in a matrix structure and switches 2251, 2252, and 2253 connected to the plurality of heaters 225, respectively. In the exemplary embodiment of the present invention, the heater matrix according to the present invention may be provided to be arranged based on rows and columns. The heater matrix has a plurality of rows and a plurality of rows, and the heaters 225', 225", 225''', 225'''' . . . may be connected to intersections thereof.

In the exemplary embodiment of the present invention, the support unit 200 of the present invention may include a first switch 2251 and a second switch 2252 connected to rows of the matrix and a third switch 2253 connected to a column of the matrix.

Referring to FIG. 4, each row of the heater 225 matrix may be connected with the first switch 2251 capable of controlling a current applied to the row of the matrix. Each row of the heater 225 matrix may be connected with the second switch 2252 connected in parallel with the first switch 2251 capable of controlling the current applied to the row of the matrix.

The first switch 2251 and the second switch 2252 are connected to each row of the heater 225 matrix. In the exemplary embodiment, when four rows are provided to the heater 225 matrix, total four first switches 2251a, 2251b, 2251c, and 2251d, and four second switches 2252a, 2252b, 2252c, and 2252d may be provided. In the exemplary embodiment, when n rows are provided to the heater 225 matrix, total n first switches 2251a, . . . , 2251n and n second switches 2252a, . . . , 2252n may be provided. That is, in the exemplary embodiment of the present invention, the first switch 2251 and the second switch 2252 may be connected for each row of the matrix, respectively.

In the exemplary embodiment, one end of the second switch 2252 is connected in parallel with one end of the first switch 2251, and the other end of the second switch 2252 may be connected to the ground.

The support unit of the present invention may further include a third switch 2253 connected to each column of the matrix. The third switches 2253 may be provided in the same number as the number of columns of the matrix.

Although not illustrated in FIG. 4, the support unit 200 according to the present invention may further include a control unit 290 for controlling the on/off of the first switch 2251, the second switch 2252 and the third switch 2253. The control unit according to the present invention may connect the first switch 2251 of the row connected to the target heater 225 and the third switch 2253 of the column connected to the target heater 225, in order to measure the current of the target heater 225 included in the matrix. The control unit according to the present invention may control the second switches 2252 of other rows which are not connected with the target heater 225 to be connected. Thus, there is an effect of being configured so that the current flows only in the target heater 225, and as a result, there is an effect of enabling the accurate current measurement in the target heater 225.

In more detail, a control method of the control unit will be described below with reference to FIG. 5.

A target heater 225' may be set among the plurality of heaters 225 arranged in the matrix form. The control unit according to the present invention may control a first switch 2251a of a row connected with the target heater 225' to be turned on. In addition the control unit according to the present invention may control all second switches 2252b, 2252c, and 2252d connected to the remaining rows other than the row connected with the target heater 225' to be turned on.

In addition, the control unit according to the present invention may control a third switch 2253a of a row connected with the target heater 225' to be turned on.

That is, the control unit according to the present invention may control the first switch 2251a of the row connected with the target heater 225' to be turned on, control the second switches 2252b, 2252c, and 2252d connected to the remaining rows other than the row connected with the target heater 225' to be turned on, and control the third switch 2253a of the row connected with the target heater 225' to be turned on, thereby controlling the current to flow only through the target heater 225' among the plurality of heaters. That is, the control unit according to the present invention may control any one of the first switch 2251a and the second switch 2252a connected for each of the plurality of rows included in the heater matrix to be connected, and the control unit may control only any one of the first switches 2251a, 2251b, 2251c, and 2251d corresponding to the number of the plurality of rows to be connected and control the second switches 2252 in the remaining rows to be connected. As a result, the control unit may control the current to flow through only the target heater 225' among the plurality of heaters, and measure a current value which does not pass through the remaining heaters except for the target heater 225' among the plurality of heaters.

Figure 5:
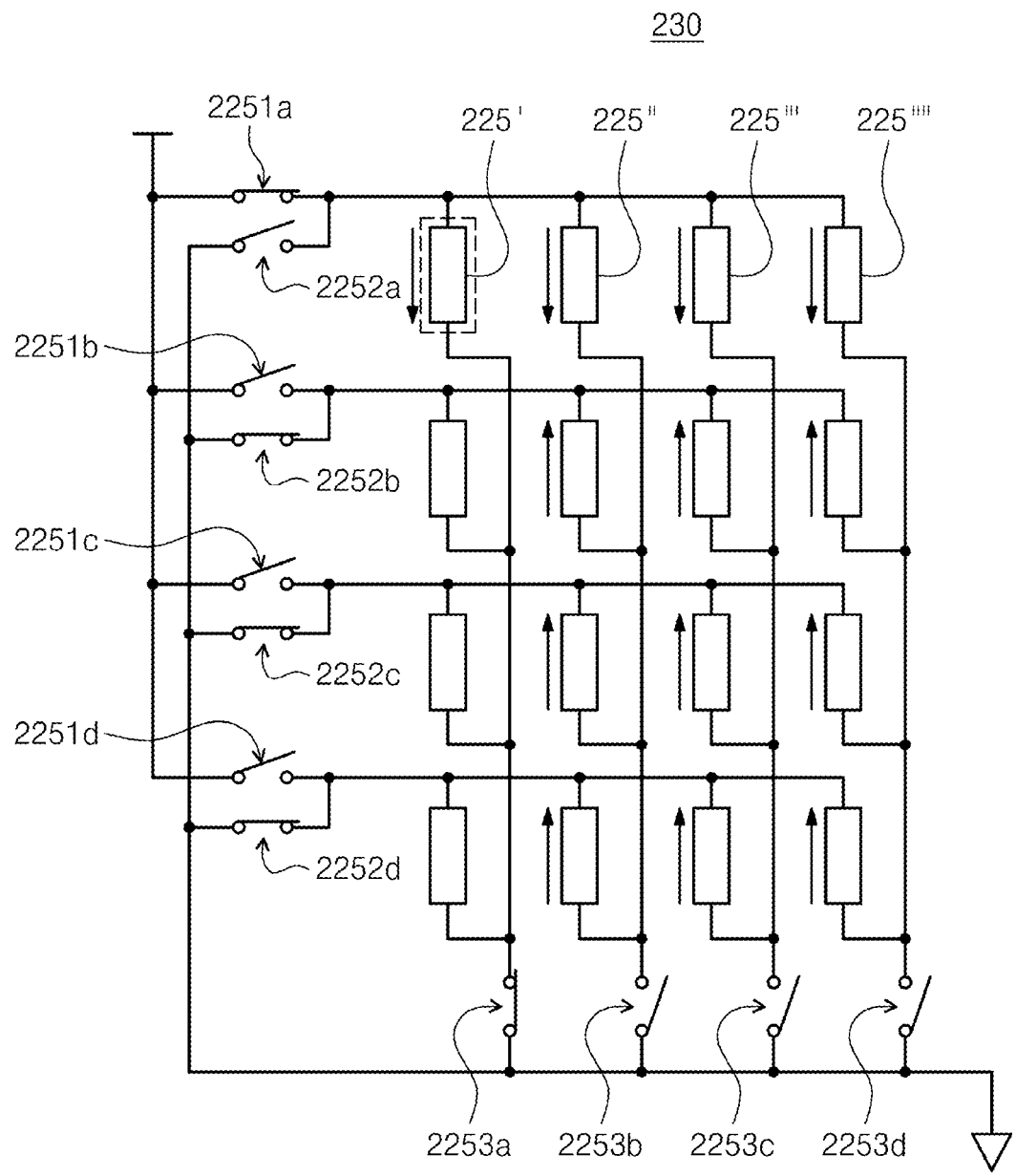
FIG. 5 is a diagram for describing measuring a current of a target heater by controlling a switch of a heater matrix according to an exemplary embodiment of the present invention.

In the exemplary embodiment of FIGS. 4 and 5, in the process of measuring the current, a pair of the first switch 2251 and the second switch 2252 connected to each row of the heater 225 matrix may be provided by the number of rows in the heater 225 matrix. In the exemplary embodiment of FIGS. 4 and 5, four pairs of first switches 2251 and second switches 2252 may be provided, and among four first switches 2251 and four second switches 2252 included in four pairs, one first switch 2251a may be turned on and three second switches 2252b, 2252c, and 2252d may be turned on.

In the present invention, the second switches 2252b, 2252c, and 2252d are connected to the heaters in the remaining rows that are not connected with the target heater 225', so that the current flowing in the remaining rows may be controlled to be connected as the ground.

In the exemplary embodiment, the first switch 2251 may be a power supplying switch. In the exemplary embodiment, the second switch 2252 may be a power blocking switch. In the exemplary embodiment, the third switch 2253 may be a power returning switch.

In the case of using the structure of heater 225 according to the present invention, since the current flows in addition to the target heater 225', but the current flowing to the lower switch corresponds to the current passing through only the target heater 225', the heat value and temperature of the desired target heater 225' may be accurately calculated using the same.

Figure 6:
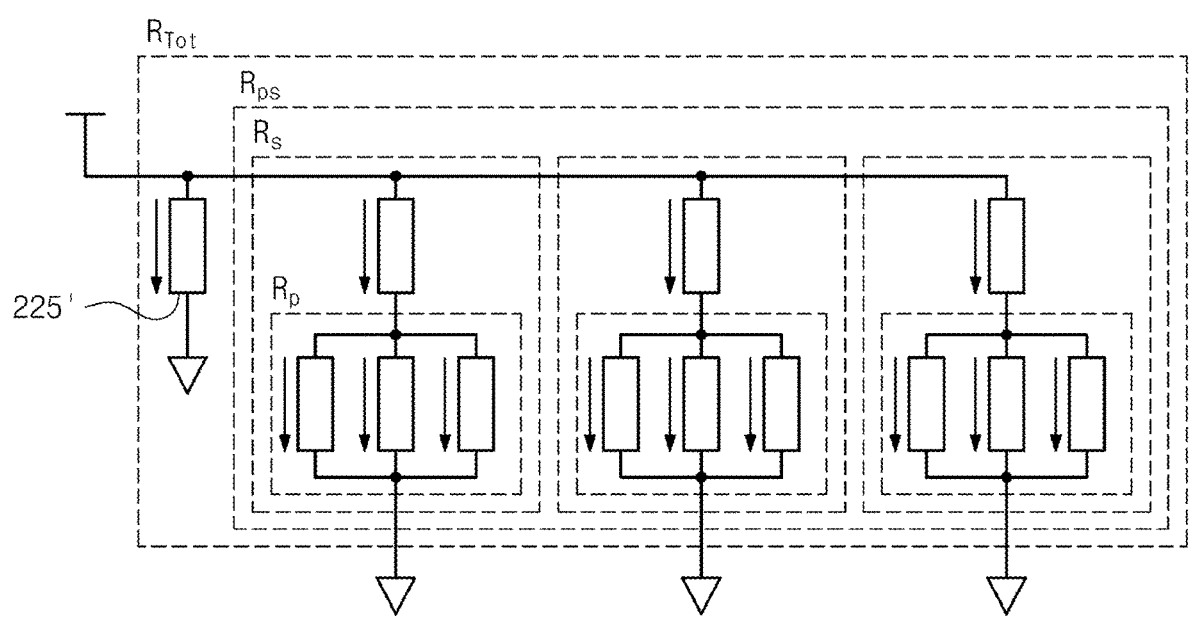
FIG. 6 illustrates an equivalent circuit for describing measuring the current of the target heater according to an exemplary embodiment of the present invention.

FIG. 6 illustrates an equivalent circuit for describing measuring the current of the target heater 225' according to an exemplary embodiment of the present invention.

FIG. 6 illustrates a circuit structure of the matrix heater according to FIG. 5 as an equivalent circuit. As illustrated in FIG. 5, when one target heater 225' is set, the current flowing in the target heater 225' shown on the leftmost side is supplied only to cells of the desired target heater 225' to calculate the temperature through the resistance of the target heater 225' by the measurement of the voltage and current. When the resistance in each heater is assumed as R, it is as follows.

As a result, there is an effect of enabling precise temperature control by making a configuration of a feedback loop that could not be applied in related art.

Through the equivalent circuit, the resistance may be calculated by the following equations.

$$R_P = \frac{R}{3} = \frac{1}{3}R$$

$$R_S = R + \frac{R}{3} = \frac{4}{3}R$$

$$R_{PS} = \frac{R_S}{3} = \frac{\frac{4R}{3}}{3} = \frac{4}{9}R$$

$$R_{tot} = \frac{1}{\frac{1}{R} + \frac{1}{R_{PS}}} = \frac{4}{13}R$$

Figure 7:
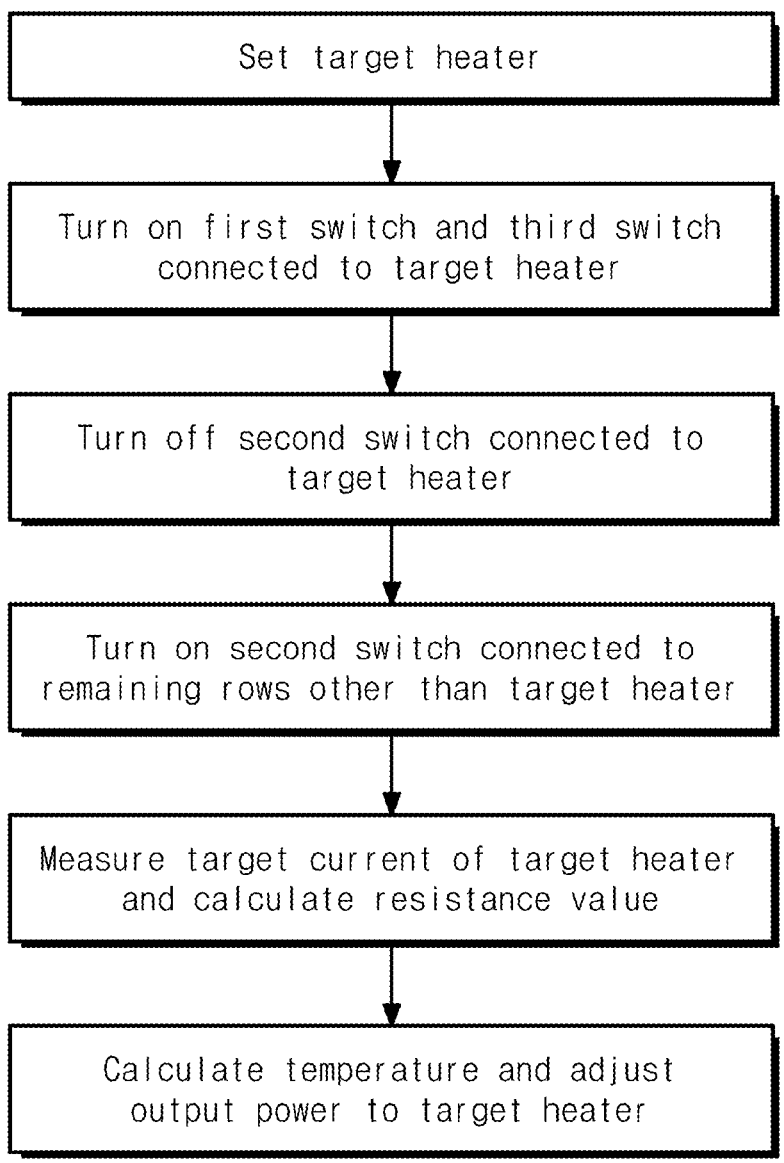
FIG. 7 is a flowchart illustrating a temperature control method according to an exemplary embodiment of the present invention.

FIG. 7 is a flowchart illustrating a temperature control method according to an exemplary embodiment of the present invention.

According to the temperature control method according to the present invention, the current flowing through the target heater 225' is measured and as a result, the resistance value may be calculated. In addition, as a result, the temperatures in the region of the target heater 225' may be calculated and compared to each other to adjust the output power at the target heater 225'.

That is, in the temperature control method according to the present invention, the target current measurement and the resistance value calculation at the target heater 225' may be performed. This indicates that the target current may be controlled to be supplied to only the target heater 225' through the switch control in the switch structure according to the present invention, thereby calculating the temperature and adjusting the output power of the target heater 225'.

The switch control of the control unit may be performed to connect the first switch 2251 of the row connected with the target heater 225' and connect the third switch 2253 of the column connected with the target heater 225', and performed to turn off the second switch 2252 connected to the target heater 225' and turn on the second switches 2252 connected to the remaining rows other than the target heater 225'. As a result, the current may be controlled to flow in the region of the selected target heater 225'.

According to a temperature control method according to a first exemplary embodiment of the present invention, a region of a heater to be controlled as a target is selected as the target heater 225', switches are controlled so that the current flows only in the region of the selected heater 225', and then a current value flowing in the region of the selected heater 225' is measured, thereby checking the temperature of the region of the selected heater 225' and then controlling the temperature of the region of the selected heater 225'.

According to a temperature control method according to a second exemplary embodiment of the present invention, a heater region to control the temperature is set as the target heater 225', target power of the target heater 225' is set, and then switches are controlled so that the current flows only in the region of the selected heater 225', and a current value flowing in the region of the selected heater 225' is measured, thereby checking the temperature of the region of the selected heater 225' and then checking whether to match the temperature of the region of the heater 225' with the target power. At this time, the temperature control method may include controlling the temperature of the region of the heater 225', when the temperature of the region of the heater 225' is not matched.

It is to be understood that the exemplary embodiments are presented to assist in understanding of the present invention, and the scope of the present invention is not limited, and various modified exemplary embodiments thereof are included in the scope of the present invention. The drawings provided in the present invention are only illustrative of an optimal exemplary embodiment of the present invention. The technical protection scope of the present invention should be determined by the technical idea of the appended claims, and it should be understood that the technical protective scope of the present invention is not limited to the literary disclosure itself in the appended claims, but the technical value is substantially affected on the equivalent scope of the invention.

What is claimed is:

1. A chuck comprising:
   a plurality of heaters disposed in a matrix form in the chuck to heat a substrate; and
   a power supply unit for supplying power to the plurality of heaters,
   wherein a current applied to the plurality of heaters is controlled by switches connected to rows and columns of the matrix, respectively, and
   wherein the switches connected to the rows of the matrix include first switches capable of controlling the current applied to the rows of the matrix and second switches connected in parallel with the first switches.

2. The chuck of claim 1, wherein one end of the second switch is connected in parallel with one end of the first switch and an other end of the second switch is connected with ground.

3. The chuck of claim 2, wherein the first switch and the second switch are connected to each row of the matrix, respectively.

4. The chuck of claim 3, further comprising:
   third switches connected to columns of the matrix, respectively.

5. The chuck of claim 4, further comprising:
   a control unit for controlling on/off of the first switches, the second switches, and the third switches.

6. The chuck of claim 5, wherein the control unit connects the first switch of the row connected with a target heater of the plurality of heaters and the third switch of the column connected with the target heater, in order to measure the current of the target heater included in the matrix.

7. The chuck of claim 6, wherein the control unit controls the second switches of other rows which are not connected with the target heater to be connected.

8. The chuck of claim 5, wherein the control unit controls any one of the first switch and the second switch connected to each of the plurality of rows included in the matrix to be connected.

9. The chuck of claim 8, wherein the control unit controls only one of the first switches corresponding to a number of the plurality of rows to be connected and controls the second switches to be connected in remaining rows.

10. A substrate treating apparatus comprising:
    a process chamber having a treating space;
    a chuck supporting a substrate in the treating space;
    a gas supply line supplying process gas to the treating space; and
    a capacitively coupled plasma electrode plate or an inductive coil generating plasma from the process gas,
    wherein the support unit chuck includes:
    a plurality of heaters disposed in a matrix form in the support unit chuck to heat a substrate; a power supply unit for supplying power to the plurality of heaters,
    wherein current applied to the plurality of heaters is controlled by switches connected to rows and columns of the matrix, respectively, and
    wherein the switches connected to the rows of the matrix include first switches capable of controlling the current applied to the rows of the matrix and second switches connected in parallel with the first switches.

11. The substrate treating apparatus of claim 10, wherein one end of the second switch is connected in parallel with one end of the first switch and an other end of the second switch is connected with ground.

12. The substrate treating apparatus of claim 11, wherein the first switch and the second switch are connected to each row of the matrix, respectively.

13. The substrate treating apparatus of claim 12, wherein the chuck further includes third switches connected to columns of the matrix, respectively.

14. The substrate treating apparatus of claim 13, wherein the chuck further includes a control unit for controlling on/off of the first switches, the second switches, and the third switches.

15. The substrate treating apparatus of claim 14, wherein the control unit controls the first switch of the row connected with a target heater of the plurality of heaters to be connected, the third switch of the column connected with the target heater to be connected, and the second switches of other rows which are not connected with the target heater to be connected, in order to measure the current of the target heater included in the matrix.

16. A substrate treating apparatus comprising:
    a process chamber having a treating space;
    a chuck supporting a substrate in the treating space;
    a gas supply line supplying process gas to the treating space; and
    an inductive coil generating plasma from the process gas,
    wherein the chuck includes:
    a plurality of heaters disposed in a matrix form in the chuck to heat a substrate; and a power supply unit for supplying power to the plurality of heaters, wherein current applied to the plurality of heaters is controlled by switches connected to rows and columns of the matrix, respectively, and wherein the switches connected to the rows of the matrix include first switches capable of controlling the current applied to the rows of the matrix and second switches connected in parallel with the first switches.

\* \* \* \* \*